(12) United States Patent
Furuse et al.

(10) Patent No.: US 7,858,145 B2
(45) Date of Patent: Dec. 28, 2010

(54) METHOD OF MANUFACTURING ELECTROCONDUCTIVE MEMBER PATTERN, AND METHODS OF MANUFACTURING ELECTRON SOURCE AND IMAGE DISPLAYING APPARATUS EACH USING THE SAME

(75) Inventors: Tsuyoshi Furuse, Isehara (JP); Shosei Mori, Hiratsuka (JP); Masahiro Terada, Hadano (JP); Taku Shimoda, Atsugi (JP); Michiko Kato, Hiratsuka (JP)

(73) Assignee: Canon Kabushiki Kaisha, Tokyo (JP)

( * ) Notice: Subject to any disclaimer, the term of this patent is extended or adjusted under 35 U.S.C. 154(b) by 902 days.

(21) Appl. No.: 11/211,550

(22) Filed: Aug. 26, 2005

(65) Prior Publication Data

US 2006/0045961 A1 Mar. 2, 2006

(30) Foreign Application Priority Data

Aug. 31, 2004 (JP) .............................. 2004-251413

(51) Int. Cl.
B05D 5/12 (2006.01)

(52) U.S. Cl. .............................. 427/64; 427/66; 427/74

(58) Field of Classification Search ................... 427/64, 427/66, 74
See application file for complete search history.

(56) References Cited

U.S. PATENT DOCUMENTS

| | | | |
|---|---|---|---|
| 6,063,453 A * | 5/2000 | Tomida et al. .............. 427/532 |
| 6,113,448 A | 9/2000 | Kobayashi et al. ............ 445/24 |
| 6,270,389 B1 * | 8/2001 | Kobayashi et al. ............ 445/24 |
| 6,586,155 B2 * | 7/2003 | Furuse et al. ............. 430/270.1 |
| 6,825,611 B2 * | 11/2004 | Kobayashi et al. .......... 313/504 |
| 6,833,224 B2 * | 12/2004 | Furuse et al. ................. 430/16 |
| 6,992,434 B2 | 1/2006 | Terada et al. ................ 313/495 |
| 7,314,768 B2 * | 1/2008 | Furuse et al. ................. 438/21 |
| 7,335,081 B2 * | 2/2008 | Iwaki et al. .................... 445/6 |
| 2002/0041140 A1 * | 4/2002 | Rho et al. ............... 313/346 R |
| 2004/0022933 A1 | 2/2004 | Tomida et al. ................. 427/78 |
| 2004/0087239 A1 * | 5/2004 | Shimoda et al. .............. 445/50 |
| 2005/0008955 A1 * | 1/2005 | Furuse et al. ................. 430/12 |
| 2005/0266589 A1 | 12/2005 | Furuse et al. ................. 438/21 |
| 2006/0057279 A1 | 3/2006 | Terada et al. ................. 427/77 |

FOREIGN PATENT DOCUMENTS

JP 2003-31922 1/2003

\* cited by examiner

*Primary Examiner*—Brian K Talbot
(74) *Attorney, Agent, or Firm*—Fitzpatrick, Cella, Harper & Scinto

(57) ABSTRACT

Provided is a method for producing a pattern of an electroconductive member, comprising: a step of forming a resin film on a substrate surface; a step of incorporating the first metal component into the resin by applying to the resin a liquid which contains a complex of a first metal component, which contains also a second metal component different from the first component, and to which a compound forming a complex with the second metal component is contacting or contacted preliminary; and a step of baking the resin film to form the electroconductive member from the first metal component incorporated into the resin film. Thus, the second metal component is prevented from adversely affecting the first metal component to be incorporated into the resin.

6 Claims, 3 Drawing Sheets

METHOD OF MANUFACTURING ELECTROCONDUCTIVE MEMBER PATTERN, AND METHODS OF MANUFACTURING ELECTRON SOURCE AND IMAGE DISPLAYING APPARATUS EACH USING THE SAME

BACKGROUND OF THE INVENTION

1. Field of the Invention

The present invention relates to: method of manufacturing an electroconductive member pattern such as an electrode or wiring to be arranged on an electron source substrate on which an electron-emitting device is arranged; and methods of producing an electron source and an image displaying apparatus each using the forming method for an electrode or wiring.

2. Related Background Art

Conventionally known examples of a method of manufacturing an electroconductive member pattern such as an electrode or wiring on a substrate include:

(1) a method involving applying a paste containing an electroconductive material to a substrate by means of screen printing, and drying and baking the applied paste to form a pattern;

(2) a method based on transfer (offset printing);

(3) a method involving applying a solution containing a metal component to the entire surface of a substrate, drying and baking the applied solution to form a metal film, covering a predetermined region with a mask such as a photoresist, and etching the region not covered with the mask to form a pattern;

(4) a method involving adding a photosensitive material to a metal-containing paste, exposing a desired site to light, and performing development to form a pattern; and (5) a method involving mixing a photosensitive resin with a fat-soluble metal organic compound to form an electrode pattern.

However, the method (1) is hardly applicable to the formation of a fine electrode pattern, and the method (2) is insufficient in the uniformity and reproducibility of a film thickness. In addition, the method (3) involves the use of a strong acid at the time of etching particularly in the case where an electrode pattern is composed of a noble metal such as platinum, so the method is hardly applicable to the formation of a fine pattern by reason of, for example, an attack to a resist and the corrosion of an insulating substrate. Furthermore, the method (4) requires explosion-proof equipment at the time of application, drying, or baking because the method involves the use of an organic solvent, and the method requires one to pay attention to the handling of a drug to be used. In addition, the method (4) has a large problem in terms of environmental load because the method involves the use of a large amount of chlorinated solvent also at the time of development. The method (5) requires one to waste a water-soluble metal compound in an unexposed portion in a developing step, thereby resulting in an increase in cost.

Meanwhile, the applicant of the present invention has proposed a method of forming a fine electrode pattern efficiently and at low cost, involving causing a photosensitive resin pattern to absorb the solution containing metal organic compounds to form an electrode pattern (Japanese Patent Application Laid-Open No. 2003-31922).

However, the method described in Japanese Patent Application Laid-Open No. 2003-31922 involves the emergence of contamination in the solution containing a metal organic compound, so the time required for the pattern to absorb a metal component and the absorbed amount may be uneven.

SUMMARY OF THE INVENTION

An object of the present invention is to provide: a method of forming a fine electroconductive pattern simply and efficiently with low cost; a method of manufacturing an electron source provided with an electrode or wiring, which has a fine pattern and is requested to have high accuracy, by means of the forming method; and a method of manufacturing an image displaying apparatus using the electron source.

According to one aspect of the present invention, there is provided a method for producing a pattern of an electroconductive member, comprising: a step of forming a resin film on a substrate surface; a step of incorporating the first metal component into the resin by applying to the resin a liquid which contains a complex of the first metal component, which contains also the second metal component different from the first component, and to which a compound forming a complex with the second metal component is contacting or contacted preliminary; and a step of baking the resin film to form the electroconductive member from the first metal component incorporated into the resin film.

According to another aspect of the present invention, there is provided a method for producing a pattern of an electroconductive member, comprising: a step of forming a resin film on a substrate surface; a step of incorporating the first metal component into the resin by applying to the resin a liquid which contains a complex of a first metal component; and a step of baking the resin film to form the electroconductive member from the first metal component incorporated into the resin film, in which the liquid containing the complex containing the first metal component is brought into contact with a compound forming a complex with a second metal component different from the first metal component prior to or during the step of incorporating the first metal component into the resin film.

DESCRIPTION OF THE PREFERRED EMBODIMENTS

Figure 1A:
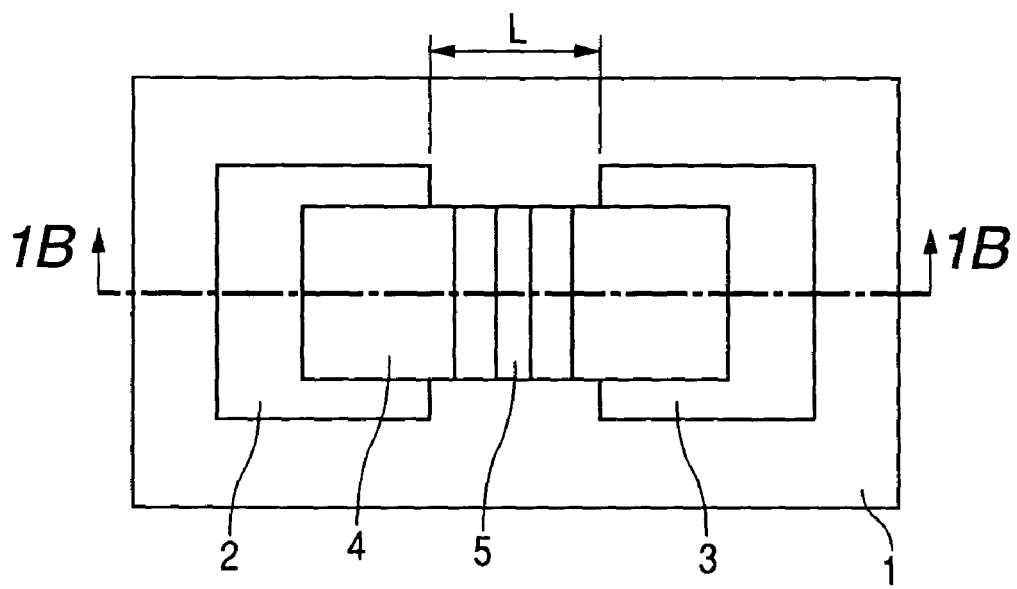
FIGS. 1A and 1B are schematic views each showing an example of an electron-emitting device constituting an electron source to be produced by means of a manufacturing method of the present invention.

According to a first aspect of the present invention, there is provided a method for producing a pattern of an electroconductive member, comprising: a step of forming a resin film on a substrate surface; a step of incorporating the first metal component into the resin by applying to the resin a liquid which contains a complex of a first metal component, which contains also a second metal component different from the first component, and to which a compound forming a complex with the second metal component is contacting or contacted preliminary; and a step of baking the resin film to form the electroconductive member from the first metal component incorporated into the resin film.

According to a second aspect of the present invention, there is provided a method for producing a pattern of an electroconductive member, comprising: a step of forming a resin film on a substrate surface;

a step of incorporating the first metal component into the resin by applying to the resin a liquid which contains a complex of a first metal component, which contains also a second metal component different from the first component, and to which a compound forming a complex with the second metal component is contacting or contacted preliminary; and a step of baking the resin film to form the electroconductive member from the first metal component incorporated into the resin film.

According to a third aspect of the present invention, there is provided a method of manufacturing an electron source including: a substrate; multiple electron-emitting devices on the substrate; and multiple row-directional wirings and multiple column-directional wirings on the substrate for matrix-wiring the multiple electron-emitting devices, including forming at least one of electrodes constituting the electron-emitting devices, the row-directional wirings, and the column-directional wirings by means of the method of manufacturing an electroconductive member pattern described above.

According to a fourth aspect of the present invention, there is provided a method of manufacturing an image displaying apparatus including: an electron source including a substrate, multiple electron-emitting devices on the substrate, and multiple row-directional wirings and multiple column-directional wirings on the substrate for matrix-wiring the multiple electron-emitting devices; and a light-emitting member that emits light when irradiated with electrons emitted from the electron-emitting devices, including forming at least one of electrodes constituting the electron-emitting devices, the row-directional wirings, and the column-directional wirings by means of the method of manufacturing an electroconductive member pattern described above.

According to the manufacturing method of the present invention, the second metal component as a foreign matter in the liquid containing the complex containing the first metal component, the second metal component being different from the first metal component, forms a complex, so the second metal component does not affect the step of incorporating the first metal component into the resin film. As a result, the first metal component can be absorbed into the resin film efficiently and uniformly, so an electroconductive member pattern having good film quality can be formed.

Therefore, according to the methods of producing an electron source and an image displaying apparatus each using the manufacturing method, a wiring or electrode can be formed in high yield and at low cost, so a reliable electron source and a reliable image displaying apparatus can be provided at low cost.

Hereinafter, preferred embodiments of the present invention will be exemplified; provided, however, that the dimensions, materials, shape, relative arrangement, and the like of components described in the preferred embodiments are not intended to limit the scope of the present invention to them.

(1) Resin

A resin to be used in the present invention preferably reacts with a first metal component in a liquid containing a complex containing the first metal component to be described later in such a manner that the first metal component is absorbed into a resin film through ion exchange. Furthermore, the resin is preferably photosensitive to facilitate patterning, and may be a water-soluble photosensitive resin or a solvent-soluble photosensitive resin. The term "water-soluble photosensitive resin" refers to a photosensitive resin that can be subjected to development in a developing step to be described later with water or a developer containing 50 wt. % or more of water, while the term "solvent-soluble photosensitive resin" refers to a photosensitive resin that is subjected to development in the developing step with an organic solvent or a developer containing 50 wt. % or more of an organic solvent.

The photosensitive resin may be of a type having a photosensitive group in a resin structure or a type in which a resin is mixed with a photosensitive agent such as a cyclized rubber-bisazide-based resist. A photosensitive resin component of any type can be appropriately mixed with a photoreaction initiator or a photoreaction inhibitor. The photosensitive resin may also be of a type in which a photosensitive resin coating film soluble in a developer is insolubilized in the developer through irradiation with light (negative type) or a type in which a photosensitive resin coating film insoluble in a developer is solubilized in the developer through irradiation with light (positive type).

In the present invention, as described above, any one of the general photosensitive resins can be widely used. Of those, a resin capable of ion exchange preferably has a carboxylic acid group. In addition, a water-soluble photosensitive resin is preferably used because a good working environment can be maintained for the resin and the waste of the resin-applies a small load to the natural environment.

The water-soluble photosensitive resin will be further described. A resin to be subjected to development with a developer containing 30 wt. % or more of water and less than 50 wt. % of a lower alcohol such as methyl alcohol or ethyl alcohol for increasing, for example, a drying speed, or a developer added with a component for promoting the dissolution or improving the stability of a photosensitive resin component, can be used as the water-soluble photosensitive resin. From the viewpoint of alleviation of environmental load, a water-soluble photosensitive resin that can be subjected to development with a developer having a water content of 50 wt. % or more is preferable, a water-soluble photosensitive resin that can be subjected to development with a developer having a water content of 70 wt. % or more is more preferable, and a water-soluble photosensitive resin that can be subjected to development with water alone as a developer is most preferable. Examples of such water-soluble photosensitive resin include those using water-soluble resins such as a polyvinyl alcohol-based resin, a polyvinyl pyrrolidone-based resin, an acrylic acid-based resin, and a methacrylic acid-based resin.

(2) Liquid Containing Complex Containing First Metal Component

A liquid containing a complex containing a first metal component to be used in the present invention is such that: the first metal component is absorbed into a resin film, or preferably is absorbed into the resin film through ion exchange when the liquid is given to the resin film; and the resin film is baked to form an electroconductive film of a metal or a metal compound. Examples of the metal component include Pt, Ag, Pd, Cu, Ni, Co, Ir and Ru, and a nitrogen-containing compound is a preferable ligand.

The liquid containing the complex containing the first metal component can be a liquid containing 50 wt. % or more of water and less than 50 wt. % of a lower alcohol such as methyl alcohol or ethyl alcohol for increasing, for example, a drying speed, or can be a liquid added with a component for promoting the dissolution, or improving the stability, of a complex. From the viewpoint of alleviation of environmental load, a liquid having a water content of 50 wt. % or more is preferable, a liquid having a water content of 70 wt. % or more is more preferable, and water itself is most preferable.

The liquid containing the complex containing the first metal component preferably contains a simple substance or compound of rhodium, bismuth, vanadium, chromium, tin, lead, silicon, or the like to improve the film quality of an electroconductive member pattern of a metal or a metal compound to be obtained and to improve adhesiveness with a substrate.

(3) Compound Forming Complex with Second Metal Component

A feature of the present invention lies in that: the liquid containing the complex containing the first metal component is brought into contact with a compound capable of forming a complex with a second metal as a foreign matter in the liquid, the second metal component being different from the first metal component, before the liquid is given to the resin film. Thus, the second metal component is transformed into a complex, and hence does not affect the step in which the first metal component in the liquid is absorbed into the resin film.

In the present invention, examples of the second metal component as a foreign matter to be transformed into a complex in the liquid containing the complex containing the first metal component include Ca, Mg, Ba, and Sr. The ions of those metals are chronologically mixed into the liquid containing the complex containing the first metal component from an environment, a device, and the like. A compound capable of forming a complex with the second metal component is preferably a compound that forms, with the second metal component, a complex which is opposite in polarity to an ion of the second metal component or is non-polar. That is, when the complex containing the first metal component is a cation and the resin is an anion, the following (a) to (c) are preferable because the formed complex containing the second metal component does not electrically adsorb to the resin, while the case where the polarity of an ion of the second metal component is maintained as it is as shown in the following (d) is not preferable because the formed complex containing the second metal component electrically adsorbs to the resin, or is present near the resin to prevent: the absorption of the first metal component to be originally absorbed into the resin film; or the complex containing the first metal component from approaching the surface of the resin film.

 (a)

 (b)

 (c)

 (d)

(In the above formulae, $M^{2+}$ represents the ion of the second metal component and Y represents a ligand that can form a complex with the second metal component.)

Examples of the compound capable of forming a complex with the second metal component include iminodiacetic acid (IDA), nitrilotriacetic acid (NTA), ethylenediamine tetraacetic acid (EDTA), diethylenetriamine pentaacetic acid (DTPA), hydroxyethylethylenediamine triacetic acid (HEDTA), and methylglycine diacetic acid (MGDA). Any one of those compounds may be directly added to the liquid containing the complex containing the first metal component, or may be chemically fixed to the surface of a carrier such as a filter before the compound is immersed in the liquid. The immersion may be performed before the liquid is given to the resin film or during the giving.

(4) Method of Manufacturing Electroconductive Member Pattern

The respective steps of the method of manufacturing an electroconductive member pattern of the present invention will be described by taking as an example the case where a photosensitive resin is used as a resin. To be specific, the method includes: a resin film forming step (an applying step, a drying step, an exposing step, and a developing step); a step of causing a metal component to be absorbed into a resin film; a washing step to be performed as required; and a baking step.

The applying step is a step of applying the photosensitive resin to a substrate on which an electroconductive member pattern is to be formed. The application can be performed by means of any one of various printing methods (such as screen printing, offset printing, and flexographic printing), a spinner method, a dipping method, a spray method, a stamp method, a rolling method, a slit coater method, an ink-jet method, and the like.

The drying step is a step of evaporating a solvent in the coating film of the photosensitive resin applied to the substrate in the applying step to dry the coating film. The coating film may be dried at room temperature, but is preferably dried under heating to shorten a drying time. The drying under heating can be performed by means of, for example, a no-wind oven, a drier, or a hot plate. The drying can be generally performed by leaving the coating film at a temperature of 50 to 100° C. for 1 to 30 minutes, although the temperature and the time vary depending on, for example, the formulation and coating weight of the applied photosensitive resin.

The exposing step is a step of exposing the photosensitive resin film on the substrate dried in the drying step to light in accordance with a predetermined pattern, that is, an electroconductive member pattern to be produced (such as the predetermined shape of an electrode or wiring). The range of the resin film to be exposed to light in the exposing step through irradiation with light varies depending on whether the photosensitive resin to be used is of a negative type or a positive type. In the case of a photosensitive resin of a negative type which is insolubilized in a developer through irradiation with light, the region of the resin film to be left is irradiated with light for exposure. In contrast to the negative type, in the case of a photosensitive resin of a positive type which is solubilized in a developer through irradiation with light, the region except the region of the resin film to be left is irradiated with light for exposure. A light-irradiation region or a non-light-irradiation region can be selected in the same manner as in the mask formation by means of an ordinary photoresist.

A focus is intentionally displaced at the time of exposure (defocus) to prevent a pattern edge portion from being non-uniform, so a uniform resin film can be formed.

The developing step is a step of removing the region except the region to be left of the photosensitive resin film exposed to light in the exposing step. When the photosensitive resin is of a negative type, the photosensitive resin film not irradiated with light is soluble in a developer and the photosensitive resin film at the exposed portion irradiated with light is insolubilized in a developer. The photosensitive resin film in the non-light-irradiation region not insolubilized in a developer is dissolved and removed by means of a developer, whereby development can be performed. When the photosensitive resin is of a positive type, the photosensitive resin film not irradiated with light is insoluble in a developer and the photosensitive resin film at the exposed portion irradiated with light is solubilized in a developer. The photosensitive resin film in the light-irradiation region solubilized in a developer is dissolved and removed by means of a developer, whereby development can be performed.

When a water-soluble photosensitive resin is used, water, the same developer as that used for an ordinary water-soluble photoresist, or the like can be used as a developer. In the case of a solvent-soluble photosensitive resin, an organic solvent or the same developer as that used for a solvent-based photoresist can be used. The case where a photosensitive resin is used in the step of forming a resin pattern has been described here. When a resin except a photosensitive resin is used, a resin pattern may be formed through printing, transfer, lift-off, or the like.

The addition of a compound capable of forming a complex with the second metal component according to the present invention to a developer can suppress the mixing of the second metal component derived from a resin film itself or from an apparatus or substrate.

The step of incorporating the first metal component into the resin film is a step of giving the liquid containing the complex containing the first metal component to the resin film formed as described above to cause the first metal component to be absorbed into the resin film, or preferably cause the first metal component to be absorbed into the resin film through ion exchange. To be specific, the step can be performed by means of, for example, a dipping method involving immersing the substrate on which the resin film is formed in the liquid containing the complex containing the first metal component, or an application method involving applying the liquid to the resin film formed on the substrate by means of a spray method or spin coating method. The resin film may be swelled by using an aqueous solvent of the liquid or the like prior to the step of incorporating the first metal component into the resin film.

When the resin film is immersed in the liquid containing the complex containing the first metal component, a resin constituting the resin film is mixed into the liquid, whereby a dissimilar metal component present in the liquid such as the second metal component can be absorbed.

The washing step is a step of removing and washing an excess liquid containing the complex containing the first metal component adhering to the resin film or the excess liquid adhering to a portion except the resin film after causing the resin film to absorb the metal component. The washing step can be performed by, for example, a method involving immersing the substrate on which the resin film is formed in the same cleaning fluid as that of the solvent in the liquid, or a method involving spraying the cleaning fluid on the substrate on which the resin film is formed.

The washing step may be performed by means of, for example, the blowing of the air or vibration as long as an excess liquid can be sufficiently shaken and fallen. The liquid is slightly removed in the washing step in some cases, but the removed amount is extremely small. Even if the removed liquid is recovered and recycled, load can be significantly reduced as compared to the conventional one.

When an immersion process involving the use of an SUS as an apparatus is used in the present invention, the apparatus such as the SUS is coated with diamond like carbon (DLC), whereby the elution from the SUS can be suppressed and the mixing of a foreign matter into an immersion liquid can be prevented.

The baking step is a step of baking the pattern of the resin film that has passed the developing step and the absorbing step, and, as required, the washing step (the photosensitive resin film in the light-irradiation region for a negative type or the photosensitive resin film in the non-light-irradiation region for a positive type) to form an electroconductive film composed of a metal or a metal compound. The baking can be performed in the air when the metal component is a noble metal. When one wishes to form a metal readily oxidized such as Cu or Pd into not an oxide but a metal film, the baking is preferably performed in a deoxidized environment (such as an inert gas atmosphere (for example, a nitrogen atmosphere)).

Next, the methods of producing an electron source and an image displaying apparatus to which the 25, method of manufacturing an electroconductive member pattern of the present invention described above is suitably applicable will be described.

The electron source according to the present invention includes: a substrate; multiple electron-emitting devices on the substrate; and multiple row-directional wirings and multiple column-directional wirings on the substrate for matrix-wiring the multiple electron-emitting devices, and at least one of electrodes of the electron-emitting devices, the row-directional wirings, and the column-directional wirings is formed by means of the method of manufacturing an electroconductive member pattern of the present invention.

Figure 1B:
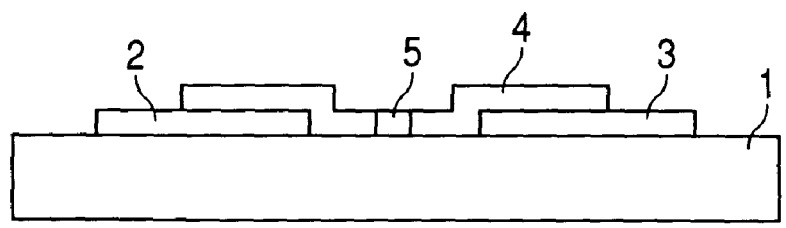

FIGS. 1A and 1B each schematically show an example of the constitution of a surface conduction electron-emitting device as an example of an electron-emitting device constituting such electron source. FIG. 1B shows a section taken along the line 1B-1B' of FIG. 1A, and in the figures, reference numeral 1 denotes a substrate; 2 and 3, device electrodes; 4, an electroconductive film; and 5, an electron-emitting portion.

The device shown in each of FIGS. 1A and 1B utilizes the phenomenon described below. The electroconductive film 4 is formed by connecting to the pair of device electrodes 2 and 3 formed on the electrically insulating substrate 1 so as to be opposed to each other. After that, the electroconductive film 4 is subjected to an energization treatment called forming to locally break, deform, or denature the electroconductive film 4, thereby forming a site including a crack and having a high electrical resistance. After that, a voltage is applied between the device electrodes 2 and 3 to cause a current in parallel with the surface of the electroconductive film 4 to flow. As a result, an electron is emitted from the site including a crack and having a high electrical resistance (the electron-emitting portion 5). Examples of other devices include a field emission electron-emitting device called an "FE type" and an electron-emitting device having a constitution of metal/insulating layer/metal called an "MIM type".

Figure 2:
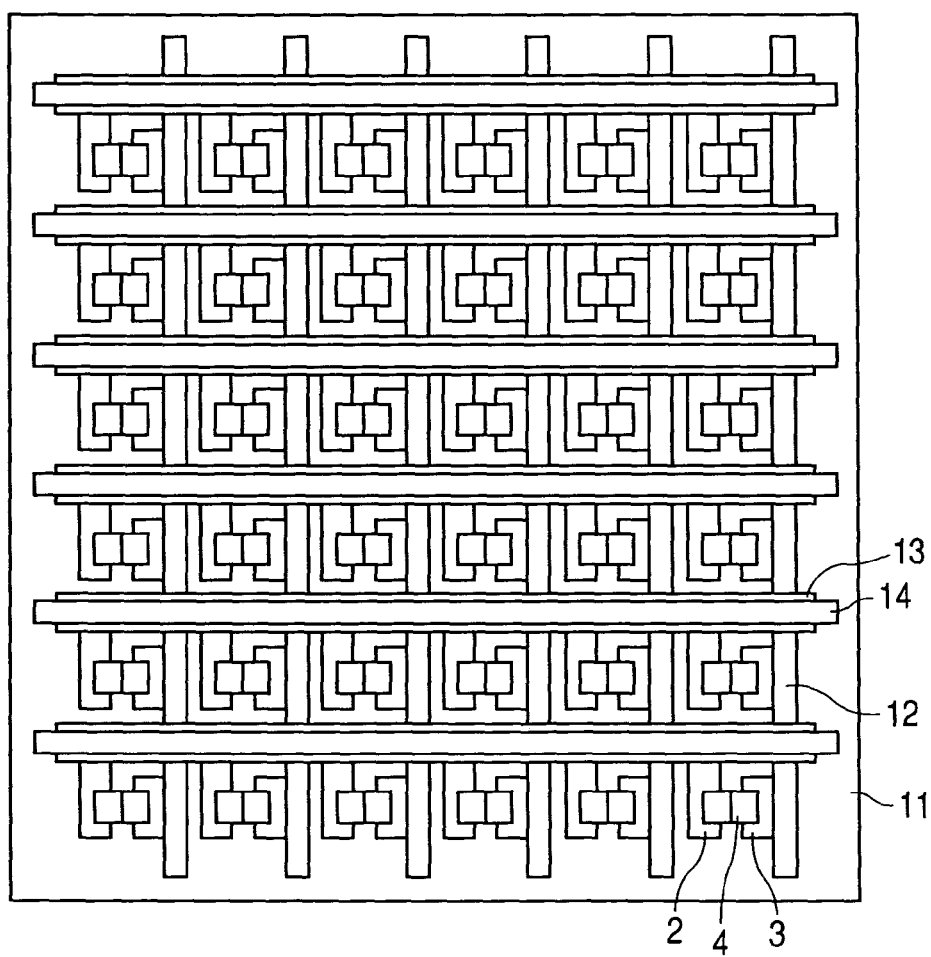
FIG. 2 is a schematic view showing an example of an electron source to be produced by the manufacturing method of the present invention.

FIG. 2 schematically shows an example of the constitution of an electron source using the electron-emitting device shown in each of FIGS. 1A and 1B. In the figure, reference numeral 11 denotes a substrate; 12, a lower wiring; 13, an interlayer insulating layer; and 14, an upper wiring. The electron source of this example is formed by wiring and connecting multiple electron-emitting devices in a matrix manner on the substrate 11, and the constitution of each of the electron-emitting devices is the same as that shown in each of FIGS. 1A and 1B. The electron source shown in FIG. 2 is obtained by: arranging multiple electron-emitting devices each having the pair of device electrodes 2 and 3 in the X and Y directions in a matrix manner; commonly connecting the device electrodes 2 of the multiple electron-emitting devices arranged in the same row to the upper wiring 14 in the X direction; and commonly connecting the device electrodes 3 of the multiple electron-emitting devices arranged in the same column to the lower wiring 12 in the Y direction. This is so-called simple matrix arrangement.

In the method of manufacturing an electron source of the present invention, the lower wiring 12 can be formed simultaneously with the formation of the electrode portions 3.

The electron source according to the present invention can be combined with a light-emitting member that emits light when irradiated with electrons emitted from the electron-emitting devices of the electron source to constitute an image displaying apparatus. When one having a phosphor that emits visible light with the aid of an electron is used as the light-emitting member, the image displaying apparatus can be a display panel to be used as a television or a computer display.

Figure 3:
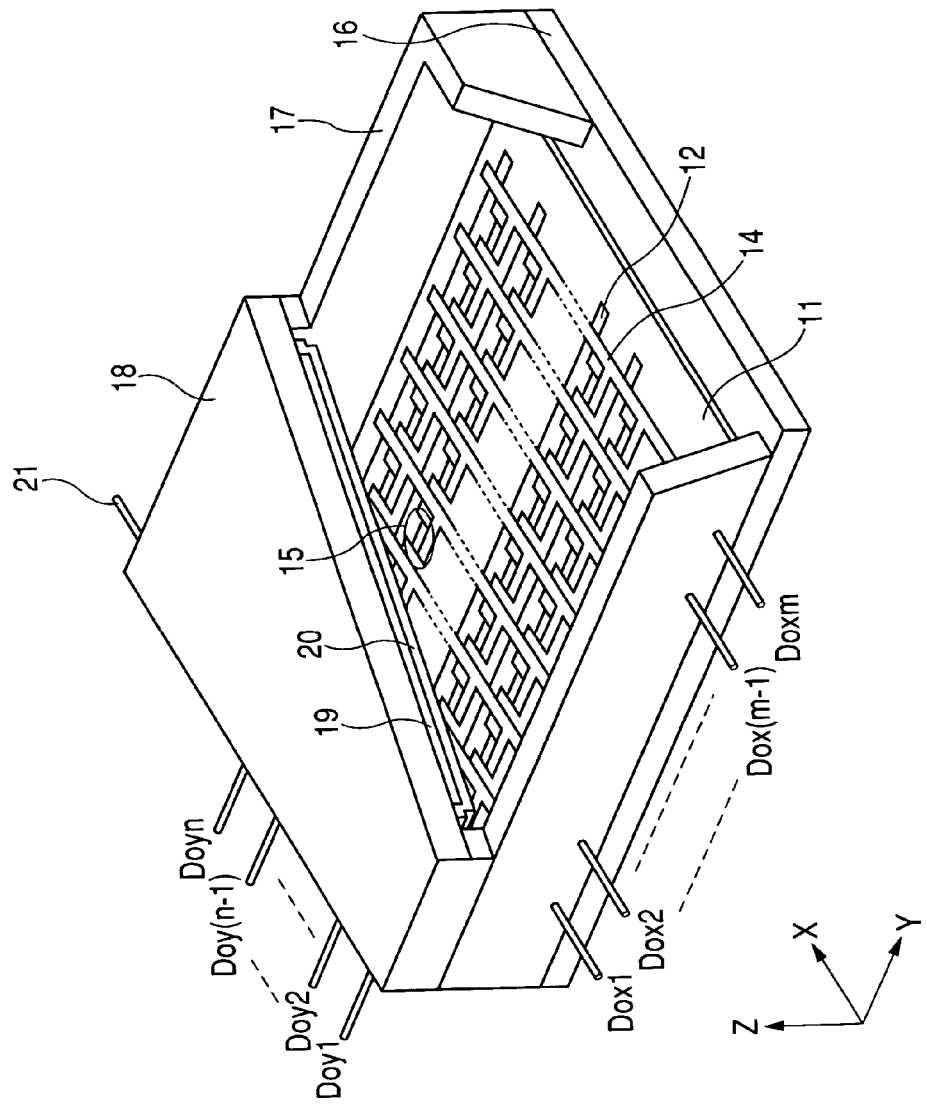
FIG. 3 is a schematic view showing an example of an image displaying apparatus to be produced by means of a manufacturing method of the present invention.

An example of an image displaying apparatus using the electron source having simple matrix arrangement shown in FIG. 2 will be described with reference to FIG. 3. FIG. 3 is a partially exploded schematic view showing the display panel of the image displaying apparatus of the present invention.

In FIG. 3, reference numeral 15 denotes the electron-emitting device shown in each of FIGS. 1A and 1B; 16, a rear plate; and 18, a face plate composed of a glass substrate. A phosphor film 19, a metal back 20, and the like are formed on the internal surface of the face plate 18. Reference numeral 17 denotes a support frame and reference numeral 21 denotes a high voltage power source. The rear plate 16, the support frame 17, and the face plate 18 are sealed in a vacuum at about $10^{-5}$ Pa, thereby constituting an envelope. When the electron-source substrate 11 has a sufficient strength, the electron source substrate 11 and the support frame 17 may be directly bonded to each other without the use of the rear plate 16.

Also, an envelope having a sufficient strength against the atmospheric pressure can be constituted even in the case of a large area panel by arranging a support (not shown) called a spacer between the face plate 18 and the electron source substrate 11.

Additionally, a getter treatment is preferably performed before or after the sealing in order to maintain the degree of vacuum inside the envelope after the sealing.

EXAMPLE

Example 1

A photosensitive resin (a methacrylic acid-methyl methacrylate-ethyl acrylate-n-butyl acrylate-azobisisobutyronitrile copolymer) was applied to the entire surface of a glass substrate (measuring 75 mm long by 75 mm wide by 2.8 mm thick) by means of a roll coater, and was dried at 45° C. for 2 minutes by means of a hot plate. Next, a negative photomask was brought into contact with the substrate, and the whole was exposed to light by means of an ultra-high pressure mercury lamp (having an illuminance of 8.9 mW/cm$^2$) as a light source for an exposure time of 2 seconds. Then, the resultant was treated for 30 seconds through dipping in pure water as a developer to prepare a resin pattern of interest. The resin pattern had a film thickness of 0.8 μm.

An aqueous solution of tris(2,2'-bipyridine)ruthenium acetate (ruthenium: 0.2 wt. %) was prepared, and was added with 0.01 wt. % of nitrilotriacetic acid (NTA). After having been immersed in pure water for 30 seconds, the substrate having the resin pattern formed thereon was immersed in the ruthenium complex-containing solution for 2 minutes.

Then, the substrate was taken out, washed with flowing water for 5 seconds, and dried by means of a hot plate at 80° C. for 3 minutes. After that, the substrate was baked in a circulating hot air oven at 500° C. for 30 minutes, thereby forming a pair of ruthenium oxide electrodes each having a width of 60 μm, a length of 120 μm, and a thickness of 50 nm with a distance of 20 μm between them.

The formation of the ruthenium oxide electrodes was repeated 20 times, and the resistance was measured. As a result, a variation in resistance of the 20 electrodes was 2.5%, which is a good result.

Example 2

The formation of a ruthenium oxide electrode was repeated 20 times in the same manner as in Example 1 except that diammonium ethylenediamine tetraacetate was added instead of nitrilotriacetic acid (NTA), and a variation in resistance was measured. As a result, the variation was 2.4%.

Comparative Example 1

The formation of a ruthenium oxide electrode was repeated 20 times in the same manner as in Example 1 except that nitrilotriacetic acid (NTA) was not added, and a variation in resistance was measured. As a result, the variation was 10.8%.

Example 3

The formation of a ruthenium oxide electrode was repeated 20 times in the same manner as in Example 1 except that an iminodiacetic acid (IDA) fixing filter (manufactured by Chelest Corporation, Chelest Fiber IRY-C10) was used to circulate and filter the ruthenium complex-containing solution, and a variation in resistance was measured. As a result, the variation was 2.1%.

The electron-emitting devices each produced by forming the device electrodes shown in each of FIGS. 1A and 1B by means of the method described in each of the above examples showed good electron-emitting properties with good reproducibility.

When the device electrodes 2 and 3 of each of the electron-emitting devices of the electron source shown in FIG. 2 were formed by means of the method described in each of the above examples, uniform electron-emitting properties were shown among the electron-emitting devices.

When the device electrodes 2 and 3, and the lower wiring 12 and the upper wiring 14 of each of the electron-emitting devices of the electron source shown in FIG. 2 were formed by means of the method described in each of the above examples, additionally uniform electron-emitting properties were shown among the electron-emitting devices.

When the electron source produced by means of the above method was applied to the image displaying apparatus shown in FIG. 3, an image displaying apparatus having good display performance and high reliability was obtained.

This application claims priority from Japanese Patent Application No. 2004-251413 filed on Aug. 31, 2004, which is hereby incorporated by reference herein.

What is claimed is:

1. A method for producing an electroconductive member pattern, comprising the steps of:
  forming a resin film on a surface of a substrate;
  incorporating a first metal component into the resin film by applying a liquid, which contains a complex containing the first metal component, and a second metal component different from the first metal component, to the resin film;
  adding, to the liquid, a compound which reacts with the second metal component to form a non-polar complex, or a compound which reacts with the second metal component to form in the liquid a complex opposite in polarity to an ion of the second metal component, before or during the step of incorporating the first metal component into the resin film; and forming an electroconductive member pattern by baking the resin film incorporating the first metal component, wherein the second metal component comprises at least one of Ca, Mg, Ba, and Sr, and wherein the compound comprises at least one selected from iminodiacetic acid, nitrilotriacetic acid, ethylenediamine tetraacetic acid, diethylenetriamine pentaacetic acid, hydroxyethylethylenediamine triacetic acid, and methylglycine diacetic acid, wherein the liquid is an aqueous solution, the complex containing the first metal component is tris(2,2'-bipyridine) ruthenium acetate, the compound is nitrilotriacetic acid, and the non-polar complex formed with the second metal component suppresses incorporation of the second metal component into the resin film.

2. A method of manufacturing an electron source including: a substrate; multiple electron-emitting devices on the substrate; and multiple row-directional wirings and multiple column-directional wirings on the substrate for matrix-wiring the multiple electron-emitting devices, comprising forming at least one of electrodes constituting the electron-emitting devices, the row-directional wirings, and the column-directional wirings by means of the method of manufacturing an electroconductive member pattern according to claim 1.

3. A method of manufacturing an image displaying apparatus including: an electron source including a substrate, multiple electron-emitting devices on the substrate, and multiple row-directional wirings and multiple column-directional wirings on the substrate for matrix-wiring the multiple electron-emitting devices; and a light-emitting member that emits light when irradiated with electrons emitted from the electron-emitting devices, comprising forming at least one of electrodes constituting the electron-emitting devices, the row-directional wirings, and the column-directional wirings by means of the method of manufacturing an electroconductive member pattern according to claim 1.

4. A method for producing an electroconductive member pattern, comprising the steps of:

forming a resin film on a surface of a substrate;

incorporating a first metal component into the resin by applying a liquid, which contains a complex containing the first metal component, and a second metal component different from the first metal component, to the resin film;

setting the liquid to touch a compound which reacts with the second metal component to form a non-polar complex, or to touch a compound which reacts with the second metal component to form in the liquid a complex opposite in polarity to an ion of the second metal component, before or during the step of incorporating the first metal component into the resin film; and forming an electroconductive member pattern by baking the resin film incorporating the first metal component, wherein the second metal component comprises at least one of Ca, Mg, Ba, and Sr, and wherein the compound comprises at least one selected from nitrilotriacetic acid, ethylenediamine tetraacetic acid, diethylenetriamine pentaacetic acid, hydroxyethylethylenediamine triacetic acid, and methylglycine diacetic acid, wherein the liquid is an aqueous solution, the complex containing the first metal component is tris(2,2'-bipyridine)ruthenium acetate, the compound is nitrilotriacetic acid, and the non-polar complex formed with the second metal component suppresses incorporation of the second metal component into the resin film.

5. A method of manufacturing an electron source including: a substrate; multiple electron-emitting devices on the substrate; and multiple row-directional wirings and multiple column-directional wirings on the substrate for matrix-wiring the multiple electron-emitting devices, comprising forming at least one of electrodes constituting the electron-emitting devices, the row-directional wirings, and the column-directional wirings by means of the method of manufacturing an electroconductive member pattern according to claim 4.

6. A method of manufacturing an image displaying apparatus including: an electron source including a substrate, multiple electron-emitting devices on the substrate, and multiple row-directional wirings and multiple column-directional wirings on the substrate for matrix-wiring the multiple electron-emitting devices; and a light-emitting member that emits light when irradiated with electrons emitted from the electron-emitting devices, comprising forming at least one of electrodes constituting the electron-emitting devices, the row-directional wirings, and the column-directional wirings by means of the method of manufacturing an electroconductive member pattern according to claim 4.

* * * * *